United States Patent
Yang et al.

(10) Patent No.: US 7,265,037 B2
(45) Date of Patent: Sep. 4, 2007

(54) NANOWIRE ARRAY AND NANOWIRE SOLAR CELLS AND METHODS FOR FORMING THE SAME

(75) Inventors: Peidong Yang, Berkeley, CA (US); Lori Greene, Berkeley, CA (US); Matthew Law, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/868,421

(22) Filed: Jun. 14, 2004

(65) Prior Publication Data
US 2005/0009224 A1 Jan. 13, 2005

Related U.S. Application Data

(60) Provisional application No. 60/480,256, filed on Jun. 20, 2003.

(51) Int. Cl.
*H01L 21/20* (2006.01)

(52) U.S. Cl. ............... 438/497; 438/500; 977/762

(58) Field of Classification Search ............... 438/478, 438/497, 500
See application file for complete search history.

(56) References Cited

OTHER PUBLICATIONS

O'Hare et al.; "Improved routes to nanocrystalline metal oxide films for dye-sensitized solar cells and related application"; Materials Resarch Society Symposium Proceeding (2001), 668 (II-VI Compound Semiconductor Photovoltaic Materials), pp. HB. 14/1-6/.*
Fujita et al.; "Crystal shapes of zinc oxide prepared by the homogeneous precipitation method", Yogyo Kyokaishi (1984), 92(4), pp. 227-230.*
Min Guo et al., "Novel Approach To Preparing Well-Oriented ZnO Nanorods On Substrate", ACTA Chimca Sinica, vol. 61, 2003, No. 8, pp. 1-7.*
Gun Min et al., "Preparation and Characterization Of Highly Oriented ZnO Single Crystal Submircorod Arrays", Acta Phys. —Chim.Sin., 2003, 19(5), pp. 1-5.*
Burgelman, Marc et al.; "Network of flatband solar cells as a model for solid-state nanostructured solar cells"; 2004; *Journal of Applied Physics*, vol. 95, No. 4, pp. 2020-2024.
Cao, H. et al.; "Microlaser made of disordered media"; 2000, *Applied Physics*, vol. 76, No. 21, pp. 2997-2999.
Gratzel, Michael; "Mesoporous oxide junctions and nanostructured solar cells"; 1999, *Current Opinion in Colloid & Interface Science*, vol. 4, pp. 314-321.
Greene, Lori E. et al.; "Low-Temperature Wafer-Scale Production of ZnO Nanowire Arrays"; 2003, *Angew. Chem. Int. Ed.*, vol. 42, pp. 3031-3034.
Kho, Joong-Gon et al.; "Photoluminescence of the Mn-doped $ZnGa_2O_4$ Phosphors Prepared by Coprecipitation of Metal Salts"; 1999, *Bull. Korean Chem. Soc.*, vol. 20, No. 9, pp. 1035-1039.

(Continued)

*Primary Examiner*—Trung Dang
(74) *Attorney, Agent, or Firm*—R'Sue P. Caron; Lawrence Berkeley National Laboratory

(57) ABSTRACT

Homogeneous and dense arrays of nanowires are described. The nanowires can be formed in solution and can have average diameters of 40-300 nm and lengths of 1-3 μm. They can be formed on any suitable substrate. Photovoltaic devices are also described.

14 Claims, 13 Drawing Sheets

OTHER PUBLICATIONS

Li, Y. et al.; "Ordered semiconductor ZnO nanowire arrays and their photoluminescence properties"; 2000, *Applied Physics Letters*, vol. 76, No. 15, pp. 2011-2013.

O'Regan, Brian et al.; "A Solid-State Dye-Sensitized Solar Cell Fabricated with Pressure-Treated P25-$TiO_2$ and CuSCN: Analysis of Pore Filling and IV Characteristics"; 2002, *Chem. Mater.*, pp. A-G.

Pacholski, Claudia et al.; "Self-Assembly of ZnO: From Nonodots to Nanorods"; 2002, *Angew. Chem. Int. Ed.*, vol. 41, No. 7, pp. 1188-1191.

Tian, Zhengrong et al.; "Biomimetic Arrays of Oriented Helical ZnO Nanorods and Columns"; 2002, *J. Am. Chem. Soc.*, vol. 124, pp. 12954-12955.

Vayssieres, Lionel et al.; "Purpose-Built Anisotropic Metal Oxide Material: 3D Highly Oriented Microrod Array of ZnO"; 2001, *J. Phys. Chem.*, vol. 105, pp. 3350-3352.

Vayssieres, Lionel et al.; "Three-Dimensional Array of Highly Oriented Crystalline ZnO Microtubes"; 2001, *Chemistry of Materials*, vol. 13, No. 12, pp. 4395-4398.

Vayssieres, Lionel et al., "Growth of Arrayed Nanorods and Nanowires of ZnO from Aqueous Solutions"; 2003, *Adv. Mater.*, vol. 15, No. 5, pp. 464-466.

Yin, A.J. et al.; "Fabrication of highly ordered metallic nanowire arrays by electrodeposition"; 2001, *Applied Physics Letters*, vol. 79, No. 7, pp. 1039-1041.

Zhang Ye et al.; "Metal-catalyst-free epitaxial growth of aligned ZnO nanowires on silicon wafers at low temperature"; 2004, *J. Phys. D: Appl. Phy.*, vol. 37, pp. 413-415.

\* cited by examiner

Hybrid: aspect ratio = 10    DSC: aspect ratio > 120

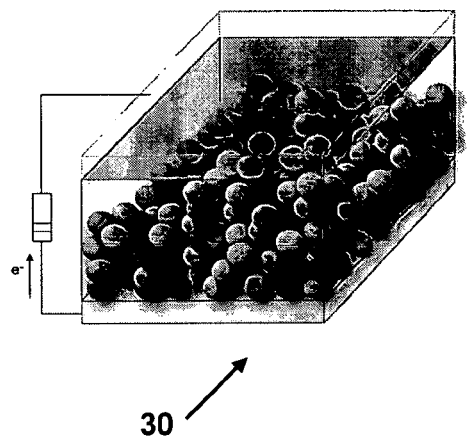
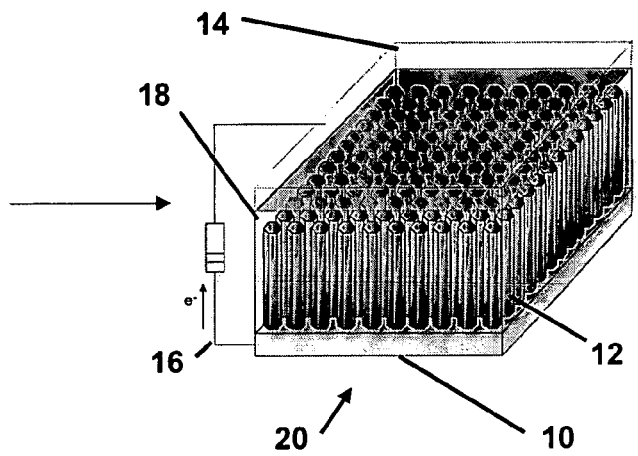
FIG. 9A  FIG. 9B
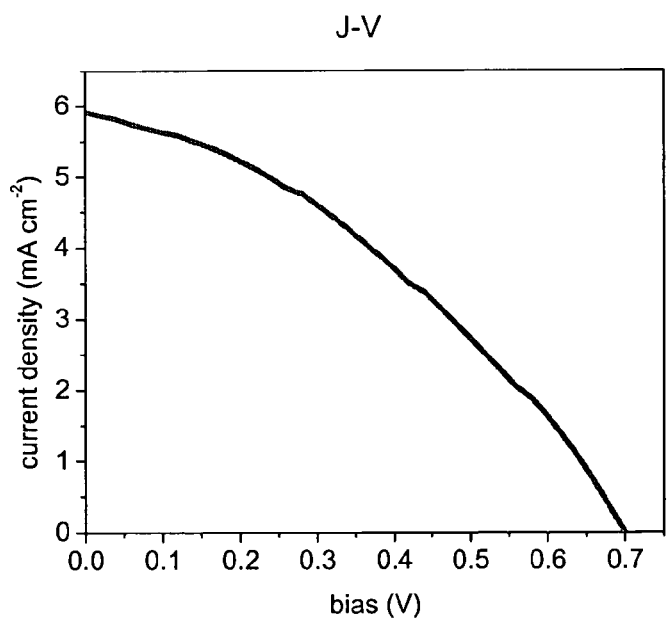
FIG. 10

NANOWIRE ARRAY AND NANOWIRE SOLAR CELLS AND METHODS FOR FORMING THE SAME

CROSS-REFERENCES TO RELATED APPLICATIONS

This patent application is a non-provisional of and claims the benefit of the filing date for U.S. patent application Ser. No. 60/480,256, filed on Jun. 20, 2003, which is herein incorporated by reference in its entirety.

STATEMENT AS TO RIGHTS TO INVENTIONS MADE UNDER FEDERALLY SPONSORED RESEARCH OR DEVELOPMENT

The invention described and claimed herein was made in part utilizing funds supplied by the United States Department of Energy under contract No. DE-AC03-76SF000-98 between the United States Department of Energy and The Regents of the University of California. The government has certain rights to the invention.

BACKGROUND OF THE INVENTION

The first solar cells were fabricated in the mid 1950s from crystalline silicon wafers. At that time, the most efficient devices converted 6% of solar power to electricity. Advancements in solar cell technology over the past 50 years have resulted in the most efficient Si cell being at 25% and commercial Si modules being at 10%.

Despite these efficiencies, the high cost of manufacturing conventional solar cells limits their widespread use as a source of power generation. The construction of conventional silicon solar cells involves four main processes: the growth of the semiconductor material, separation into wafers, formation of a device and its junctions, and encapsulation. For cell fabrication alone, thirteen steps are required to make the solar cell and of these thirteen steps, five require high temperatures (300° C.-1000° C.), high vacuum or both. In addition, the growth of the semiconductor from a melt is at temperatures above 1400° C. under an inert argon atmosphere. To obtain high efficiency devices (>10%), structures involving concentrator systems to focus sunlight onto the device, multiple semiconductors and quantum wells to absorb more light, or higher performance semiconductors such as GaAs and InP, are needed. These options all result in increased costs.

Another problem with conventional solar devices is the high cost of manufacturing materials. The amount of silicon needed for 1 kW of module output power is approximately 20 kg. At $20/kg, the material costs for electronic grade silicon are partially subsidized by the chip manufacturing sector. Other materials such as GaAs, which are synthesized with highly toxic gases, are a factor of 20 higher in cost at $400/kg. Because solar cells are large area devices, such material costs hinder the production of inexpensive cells. As a result, thin film devices, which have active layers several microns thick of amorphous Si, CdTe, and CuInSe$_2$ are being explored. Also, in 1991, O'Regan et al. reported the invention of a novel photochemical solar cell comprised of inexpensive TiO$_2$ nanocrystals and organic dye (O'Regan et al. *Nature* 353, 737 (1991)).

Embodiments of the invention improve upon such conventional devices and address the above problems individually and collectively.

SUMMARY OF THE INVENTION

Embodiments of the invention are directed to nanowire arrays, devices that use the nanowire arrays, and methods for making the same.

One embodiment of the invention is directed to a method comprising: providing a substrate; depositing ZnO nanocrystals on the substrate using a dip coating process; and contacting the substrate with a solution of zinc nitrate hexahydrate (Zn(NO$_3$)$_2$.6H$_2$O) and methenamine (C$_6$H$_{12}$N$_4$).

Another embodiment of the invention is directed to a method comprising: providing a substrate; depositing semiconductor nanocrystals on the substrate using a dip coating process; contacting the substrate with a solution comprising a semiconductor precursor; and forming an array of nanowires, wherein the nanowires comprise a semiconductor.

Another embodiment of the invention is directed to a method comprising: providing a substrate; depositing semiconductor nanocrystals on the substrate; contacting the substrate with a solution comprising a semiconductor precursor and a polyamine; and forming an array of nanowires, wherein the nanowires comprise a semiconductor.

Another embodiment of the invention is directed to a device comprising: a substrate; and an array of nanowires on the substrate, wherein each nanowire includes an aspect ratio greater than about 20 or even 120, and a length greater than about 15 or 20 microns.

Another embodiment of the invention is directed to a method for forming a branched network of metal oxide semiconductor wire structures, the method comprising: providing a substrate; depositing a first plurality of semiconductor nanocrystals on the substrate; contacting the substrate with a solution comprising a semiconductor precursor; forming an array of nanowires on the substrate; depositing a second plurality of semiconductor nanocrystals on the array of nanowires; and forming branches on the array of nanowires using the deposited second plurality of nanocrystals.

Another embodiment of the invention is directed to a device comprising: a substrate; and a branched network on the substrate, wherein the branched network comprises an array of nanowires and branches on the nanowires in the array of nanowires, wherein the branched network comprises a metal oxide semiconductor.

Another embodiment of the invention is directed to an optoelectronic device comprising: a first conductive layer; a second conductive layer; an array of semiconductor nanowires between the first and second conductive layers; and a charge transport medium between the first and second conductive layers.

These and other embodiments of the invention are described in detail below.

BRIEF DESCRIPTION OF THE DRAWINGS

FIG. 9A shows a schematic drawing of a conventional DSC.

FIG. 9B shows schematic drawing of a DSC according to an embodiment of the invention.

FIG. 10 shows a graph of current density vs. bias (V).

DETAILED DESCRIPTION

Figure 1:
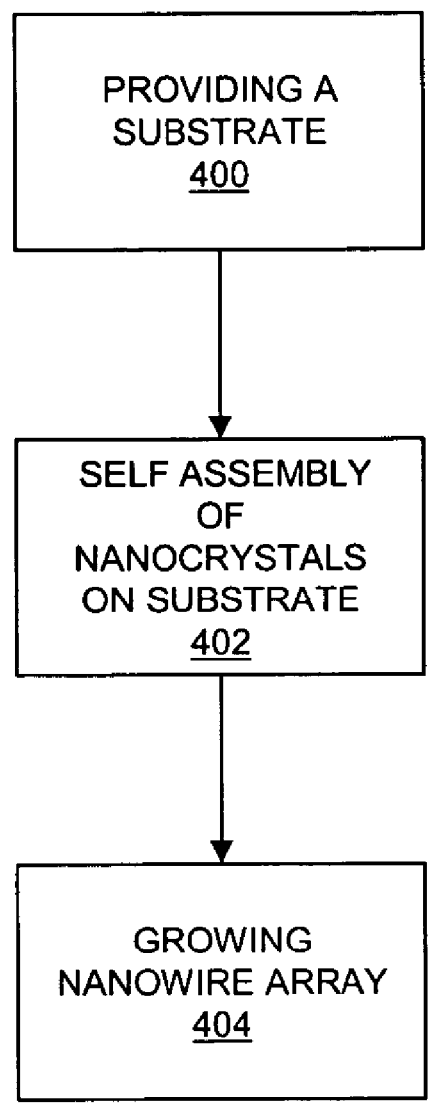
FIG. 1 shows a flowchart illustrating some steps in a method according to an embodiment of the invention.

Embodiments of the invention are directed to nanowire arrays, devices including nanowire arrays, and methods for making the same. In embodiments of the invention, synthetic methods can be used to produce homogeneous and dense arrays of nanowires. The nanowires can be grown on various substrates under mild aqueous conditions. Solution approaches to producing nanowires are appealing, because they can use low temperature processing steps that are suitable for scale-up.

In one exemplary embodiment of the invention, homogeneous and dense arrays of ZnO nanowires were synthesized on 4-inch silicon wafers using a mild solution process at 90° C. Uniform ZnO nanocrystals were first deposited on the substrates to act as seeds for subsequent hydrothermal nanowire growth on the substrates. This procedure yielded single crystalline wurtzite ZnO nanowires grown along the [0001] direction. The nanowires were oriented perpendicular to the wafer surface. By controlling the reaction time, average diameters of about 40 to about 300 nanometers and lengths of about 1 to about 3 μm were obtained for the nanowires.

Although zinc oxide (ZnO) nanowires are described in detail, it is understood that embodiments of the invention are not limited thereto. For example, instead of zinc oxide, other semiconductors such as metal oxide semiconductors (e.g., titanium oxide, zinc oxide, tin oxide, etc.) can be used in the nanowire arrays according to embodiments of the invention.

The resulting nanowire arrays according to embodiments of the invention have unexpectedly high surface areas and unexpectedly good electrical properties. The inventive methods of fabricating the nanowire arrays ensure that a majority of the nanowires in the arrays directly contact the substrate and provide continuous pathways for carrier transport. This is a desirable feature for electronic devices based on these materials. Highly efficient carrier transport (e.g., electron transport) through the substrate, to the nanowires, and though the nanowires is desirable, since this results in higher energy conversion efficiencies in devices such as photovoltaic devices.

The nanowire arrays according to embodiments of the invention can be used in any suitable device including optoelectronic devices such as photovoltaic devices (which includes solar cells). The term "photovoltaic device" includes those device architectures known in the art. Exemplary photovoltaic devices are described in, for example, *Science*, Vol. 295, pp. 2425-2427, Mar. 29, 2002, the contents of which are incorporated by reference. Such devices include dye sensitized cells (DSCs) or Grätzel cells, solid state solar cells, and organic-inorganic hybrid photovoltaic cells. In an organic-inorganic hybrid photovoltaic cell, a semiconducting or conducting polymer is used in conjunction with the array of nanowires. These and other types of devices are described in further detail below.

Embodiments of the invention can also be used in other devices, including but not limited to, acoustic wave filters, photonic crystals, light emitting diodes, photodetectors, photodiodes, optical modulator waveguides, varistors, and gas sensors.

I. General Methods for Forming Nanowire Arrays

FIG. 1 shows a flowchart illustrating steps in methods according to embodiments of the invention. First, a substrate is provided (step 400). For example, the substrate may comprise glass with indium tin oxide (ITO) coated on it, or may comprise a fluorine doped tin oxide. Nanocrystals are then deposited on the substrate, preferably through a self-assembly process (step 402). The nanocrystals may comprise the same material that will be present in the nanowires. For example, the nanocrystals may comprise a semiconducting material such as zinc oxide and the resulting nanowires could also be made of zinc oxide. After depositing the nanocrystals on the substrate, a solution then contacts the deposited nanocrystals. The solution may be formed from a semiconductor precursor (e.g., a salt) and a nanowire growth material. For example, the solution may comprise a semiconductor precursor such as zinc nitrate and a nanowire growth material such as an amine. In some embodiments, the amine is methenamine. As will be described in further detail below, one can get better aspect ratios with zinc nitrate, methenamine and PEI. After the solution contacts the deposited nanocrystals, nanowires are formed (step 404). After growing the nanowires, the nanowire array can be removed from the solution, dried, and then further processed. For example, additional layers may be formed on the nanowire array so that an optoelectronic device is formed. Each of these process steps and additional processing steps are described in further detail below.

First, a substrate is provided (step 400). The substrate may comprise any suitable material. For example, the material may be organic and/or inorganic in nature, may comprise a conducting or a semiconducting material, and/or may be transparent or semi-transparent or opaque. The material may also be rigid or flexible. Exemplary substrates include semiconductors such as silicon and gallium arsenide, metals such as titanium foil, metal oxides such as titanium oxide, tin oxide, zinc oxide, and indium tin oxide, polymers such as semiconducting polymers, insulating polymers, etc. The substrate may also be a composite material with one or more sublayers. For example, the substrate may comprise a flexible, insulating, polymer base layer which may be coated with a conductive film. Any of these characteristics and/or materials can be in the substrates according to embodiments of the invention.

After obtaining the substrate, nanocrystals are deposited on the substrate, preferably by a self-assembly process (step 402). As used herein "depositing" includes forming nanoparticles directly on the substrate. It also includes pre-forming the nanoparticles and then placing them onto the substrate surface through the use of a gaseous or liquid medium. Pacholski (Pacholski et al., *Angew. Chem. Int. Ed*., 41:1188 (2002)) describes how one can make ZnO nanocrystals (the contents of which are incorporated by reference in its entirety for all purposes). Other suitable deposition processes include spin coating, blade coating, roller coating, spraying, curtain coating, dip coating, inkjet printing and screen printing. In another embodiment, a zinc salt (e.g., zinc acetate) can be added to a substrate and it can be heated to form ZnO on the substrate. More generally, depositing a metal ion onto the surface of a substrate and heating it in the presence of oxygen can form an appropriate oxide.

In embodiments of the invention, the deposition process is preferably a dip coating process. Unlike a spin coating process, when seeding a substrate with a nanocrystal material such as ZnO, a very thin layer of nanocrystals can be produced. For example, a very thin layer of ZnO nanoparticles about 10-15 nanometers in thickness (or less) may be formed on the substrate after a dip coating process is performed. In comparison, a spin coating process may leave a 50-200 nanometer film of nanocrystals on a substrate. The use of a dip coating process to deposit nanocrystals on a substrate allows one to grow the array of nanowires very close to the substrate. When the nanowires are formed on the very thin layer of ZnO nanocrystal particles, their ends are in virtually direct contact with the substrate. A large intermediate particle layer is not between the array of nanowires and the substrate. This allows for better electron transport between the substrate and the nanowires. When the nanowires are used in a device such as a photovoltaic device, this will result in improved conversion efficiency.

The nanocrystals on the substrate may have any suitable size (however, the final wire diameter and distribution can be dependent on the size of the nanocrystals), and may comprise any suitable material. For example, in some embodiments, the nanocrystals may be about 5 to 10 nanometers in diameter. In other embodiments, the nanocrystals may be smaller or larger than this. They may contain the same materials that are present in the nanowires.

In some embodiments, before depositing the nanocrystals on the substrate, the substrate may be briefly etched with an acid to provide the surface of the substrate with a positive charge (e.g., caused by the presence of protons). Suitable acids include HCl, $HNO_3$, and other acids. In other embodiments, an electrical bias could be provided to the substrate surface to charge it. The application of electrical biases to substrates is well known to those of ordinary skill in the art. Providing a positive charge to the substrate surface improves the adhesion of the nanocrystals onto the substrate. The nanocrystals may be oppositely charged, and may adhere to the substrate by electrostatic force.

To further improve the adhesion of the nanocrystals to the substrate, the substrate may be optionally heated after they are deposited. For example, a substrate and nanocrystals can be annealed at 150° C. or more, for a predetermined period of time, to ensure that the nanocrystal particles adhere to the substrate surface.

After depositing nanocrystals on the substrate, a solution contacts the nanocrystals (step 404). The solution can be formed from a liquid medium, a semiconductor precursor, and a nanowire growth material. Suitable concentrations of the solution components and mixing procedures can be determined by those of ordinary skill in the art. Exemplary concentrations and mixing procedures are described herein in specific examples.

In embodiments of the invention, the semiconductor precursor may comprise a metal salt that can dissociate in solution. The metal of the metal salt may include metals such as Ti, Zn, Sn, etc. Suitable salts for forming zinc oxide nanowires may be zinc nitrate, zinc acetate, and hydrated forms thereof.

The nanowire growth material may comprise any suitable material that is adapted to induce the growth of nanowires in solution using the semiconductor precursor. Examples of nanowire growth materials include amines, phosphonic acids, and/or carboxylic acids. In some embodiments, the amine may be methenamine ($C_6H_{12}N_4$), which is a highly water soluble, non-ionic tetradentate cyclic tertiary amine. It is also sometimes called hexamethylenetetramine (HMTA).

In preferred embodiments, the nanowire growth material may further comprise a polyamine such as a polyethylenimine (PEI). As illustrated in further detail below, surprising and unexpected results are produced when PEI is used. PEI is a cationic polyelectrolyte and is believed to selectively hinder lateral growth of the nanowires in solution. Using PEI in the solution, the aspect ratios of the nanowires increased to above 120, or even 150. This is compared to aspect ratios of 20-25 or less when a polyamine is not used. Further data regarding the unexpected results associated with the use of polyamines are provided below.

The liquid medium may be organic and inorganic in nature. As illustrated below, the liquid medium may comprise water. The liquid medium may also comprise or be formed from an alcohol such as ethanol.

After the solution is prepared, the solution may contact the substrate and the deposited nanocrystals for an amount of time, and at a temperature and a pressure sufficient to cause the formation of nanowires on the substrate. For example, the substrate and/or the solution may be heated between about 60° C. to about 95° C. for about 0.5 to about 6 hours at ambient pressure to cause the formation of the nanowire array. The solution could also be agitated during the nanowire formation process using a mixer or a stirrer.

An array of nanowires is then formed in the solution (step 406). As used herein, a "nanowire array" includes at least some substantially linear nanowires extending substantially perpendicular to the surface of a substrate. Nanobranches may or may not be on the nanowires in the array. Embodiments with nanobranches are described in further detail below.

The resulting nanowires may comprise a semiconductor material. Examples of suitable semiconductor materials include zinc oxide (e.g., ZnO), titanium oxide (e.g., TiO2), tin oxide (e.g., SnO), etc. In some embodiments, the nanowires preferably comprise a metal oxide semiconductor. The nanowires may be single crystalline or polycrystalline, and may be doped or undoped.

The nanowires in the nanowire array may also have any suitable dimensions. For example, each of the nanowires in an array of nanowires may have a diameter of from about 1 nanometer to about 200 nanometers. They may have lengths from several microns or more (e.g., greater than about 10 or about 20 microns). The nanowires preferably have high aspect ratios. For example, the aspect ratios of the nanowires can be between about 10 to about 500, or more. The widths of the nanowires may be about 100 nanometers or less in some embodiments. For example, each nanowire may have a diameter between about 40 to about 80 nanometers. Some nanowires in the array may not have the above noted dimensions.

In one exemplary embodiment of the invention, well-aligned ZnO nanowire arrays were grown. ZnO nanocrystals about 5 to about 10 nanometers in diameter were dip coated several times onto a 4-inch Si (100) wafer to form a <15 nanometer thick film of crystal seeds. The ZnO nanocrystals were prepared according to a modified method of Pacholski (Pacholski et al., *Angew. Chem. Int. Ed.*, 41:1188 (2002)), the contents of which are incorporated by reference in its entirety. A 0.03 M NaOH solution in ethanol was added slowly to 0.01 M zinc acetate dehydrate in ethanol at 60° C. and stirred for two hours. The resulting nanoparticles were spherical and stable for at least one week in solution and longer when kept at almost freezing conditions.

After uniformly coating the silicon wafer with ZnO nanocrystals, hydrothermal ZnO growth was carried out by suspending the wafer upside-down in an open crystallizing dish filled with an aqueous solution of zinc nitrate hydrate (0.025 M) and methenamine (0.025 M) at 90° C. The reaction time in this example was from about 0.5 to about 6 hours. The wafer was then removed from solution, rinsed with deionized water and dried. A scanning electron microscope (SEM) was used to examine the morphology of the nanowire array across the entire wafer, while single nanowires were characterized by transmission electron microscopy (TEM). Nanowire crystallinity and growth direction were analyzed by X-ray diffraction and electron diffraction techniques.

SEM images taken of several 4-inch samples showed that the entire wafer was coated with a highly uniform and densely packed array of ZnO nanowires. X-ray diffraction data suggest a wurtzite ZnO pattern with an enhanced (002) peak due to the vertical orientation of the nanowires. A typical 1.5-hour synthesis yielded wires with diameters ranging between about 40 to about 80 nm and lengths of about 1.5 to about 2 μm. With a measured number density on the order of about $10^{10}$ cm$^{-2}$, these arrays had a ZnO surface area of, conservatively, at least about 50 cm$^2$ per cm$^2$ of substrate (~10 m$^2$ g$^{-1}$). The average size of the nanowires increased with longer reaction time, up to about 200 to about 300 nm wide by about 3 μm long for a 6 hour experiment. High magnification SEM imaging of a 6 hour sample revealed that the surfaces of these solution-grown wires are rough compared to the gas-phase arrays, which might be expected based on the different crystallization environments. Also, a substantial percentage of the nanowires fuse together after longer reaction times.

Figure 2:
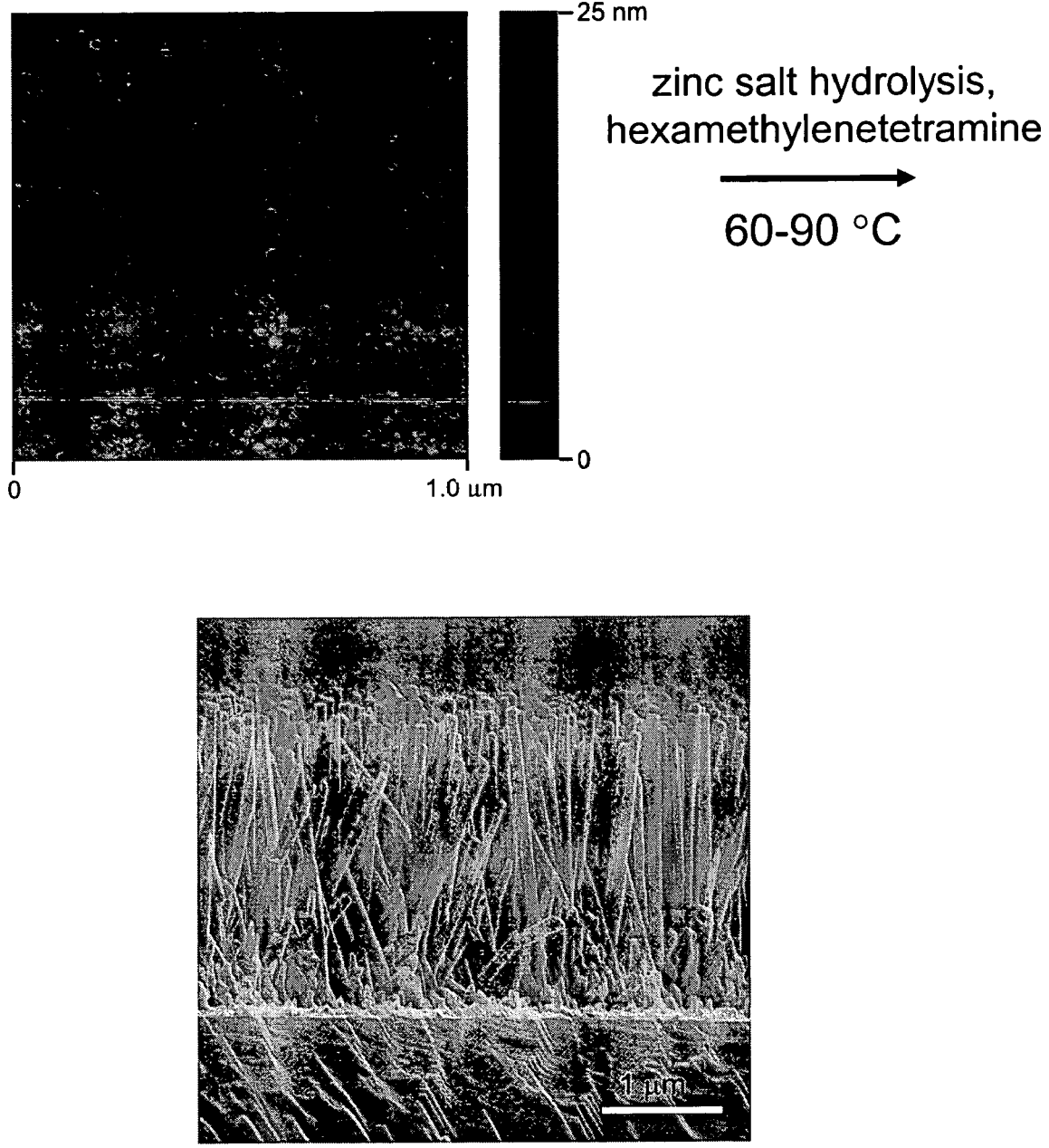
FIG. 2 shows images showing how a nanowire array is created. The first photograph shows ZnO quantum dots, while the second photograph shows nanowires grown from the quantum dots. The scale bar equals 1 µm in the bottom photograph.

FIG. 2 shows images showing how a nanowire array including long nanowires can be created. The first photograph (created using Atomic Force Microscopy or AFM) shows dip coated ZnO quantum dots or nanocrystals on a substrate. The second photograph shows nanowires grown from the nanocrystals. In the bottom photograph, the scale bar equals 1 μm. The cross-sectional SEM view of the array suggested that the ZnO nanowires grow nearly vertically and penetrated a thin (<15 nm) layer of nanocrystals. As noted above, it is desirable to make the nanoparticle layer as thin and continuous as possible (ideally a few particle diameters or less in thickness) for electronic applications.

Figure 3:
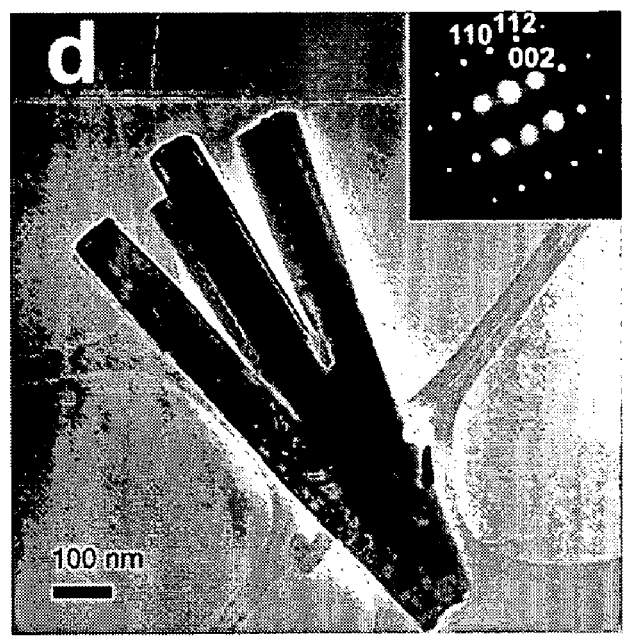
FIG. 3 shows a transmission electron micrograph of a cluster of ZnO nanowires removed from a 1.5-hour array. The scale bar is 100 nm. The inset is the [100] electron diffraction pattern of an isolated, single nanowire from a different region of the sample. The growth axis is along the [001] direction.

FIG. 3 shows a TEM characterization of individual nanowires removed from the arrays. It indicates that they are single crystalline and grow in the [0001] direction. The cluster morphology shown in the image is common and suggests that multiple nanowires often grow from a single aggregate of ZnO nanoparticles attached to the substrate.

Figure 4:
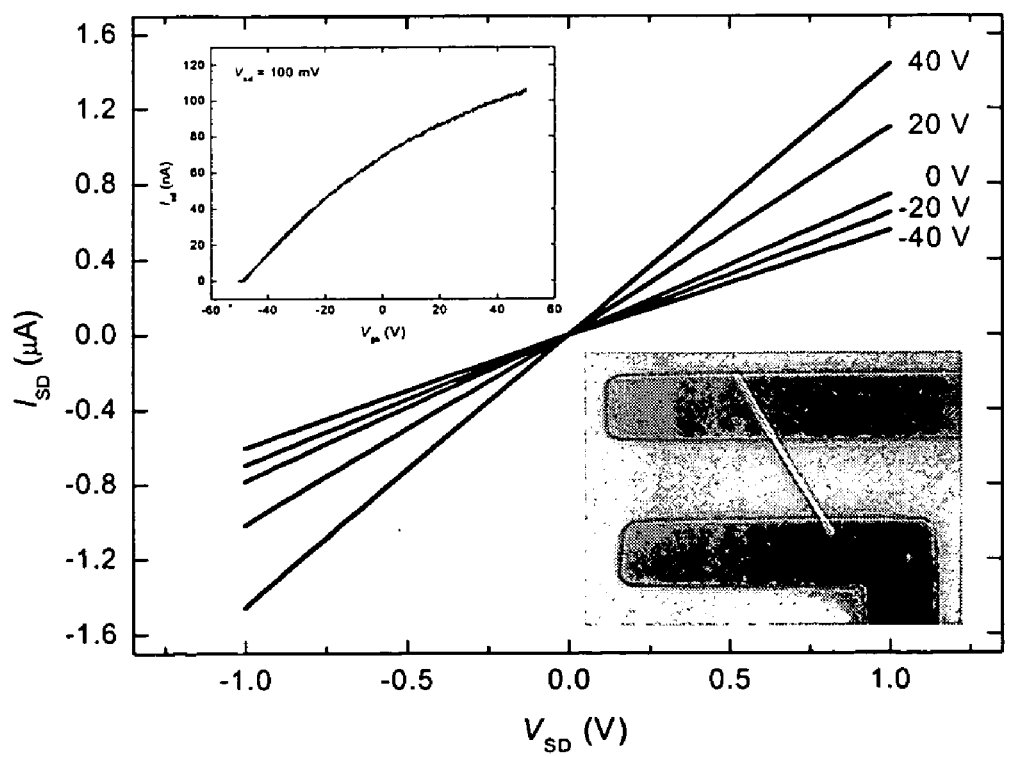
FIG. 4 shows a graph of $I_{SD}$ v. $V_G$ (source drain current vs. gate voltage).

FIG. 4 shows electrical characteristics for a single ZnO nanowire. Specifically, FIG. 4 shows I-V curves at various gate biases for a nanowire with a diameter of 75 nm, showing n-type behaviour and a resistivity of 0.65 Ωcm. The left inset shows the corresponding $I_{SD}$-$V_G$ curve at $V_{SD}$=100 mV. The ON-OFF ratio is $10^5$ at 50 volts. The right inset shows an SEM image of a ZnO NW-FET.

Figure 5:
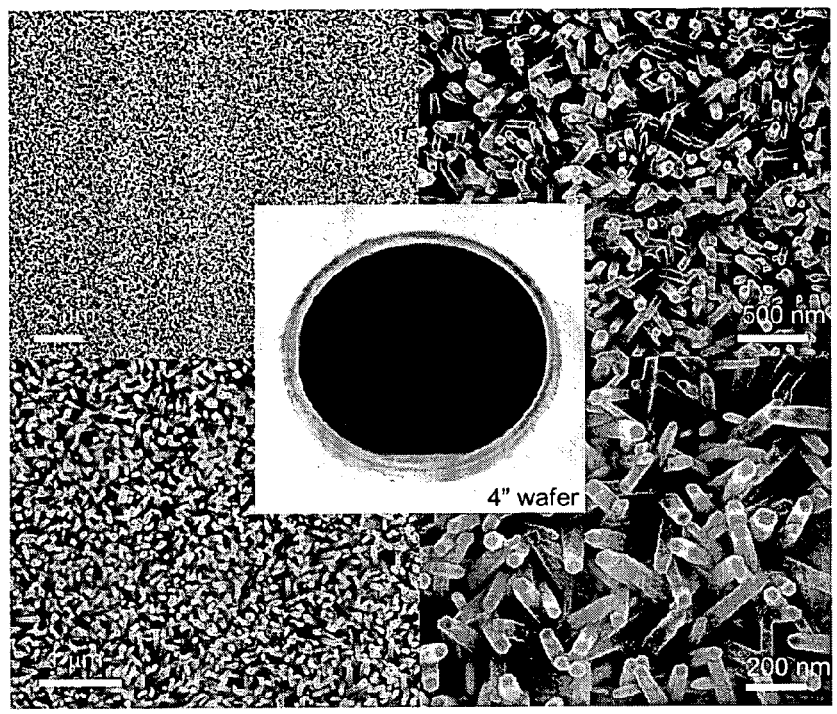
FIG. 5 shows images of a 4 inch wafer and nanowires at different scales. From the upper left and moving clockwise, the scale bars are 2 μm, 500 nm, 200 nm, and 1 μm.

FIG. 5 shows a 4 inch wafer and various SEM images of nanowires.

Figure 6:
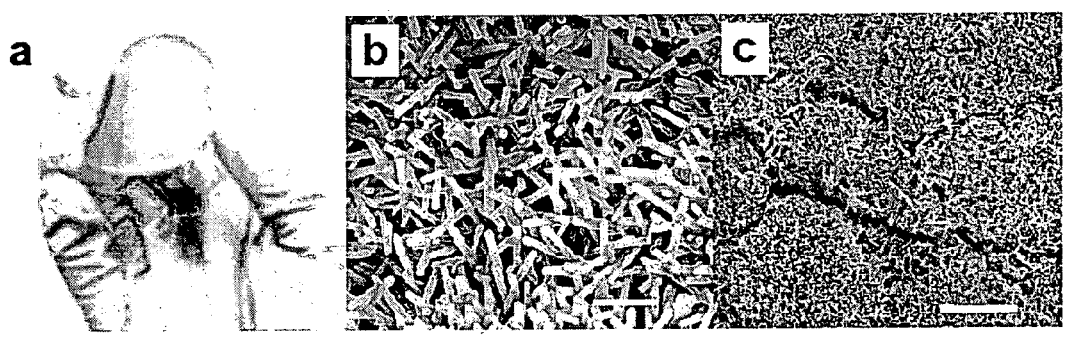
FIG. 6A shows a ZnO nanowire array on a two inch, flexible PDMS substrate. The photograph shows a flexed array of nanowires on PDMS.
FIG. 6B shows an SEM image showing the array morphology on a flexible substrate. The scale bar is 1 μm.
FIG. 6C shows a low magnification of an SEM image showing cracks formed in the array after handling. The scale bar is 5 μm.

FIGS. 6A-6C show embodiments using flexible substrates. For example, FIG. 6A shows the results of nanowire array growth on a flexible 2-inch polydimethylsiloxane (PDMS) substrate. This array is similar to those grown on silicon, except that a network of microscale cracks form due to the inflexibility of the ZnO nanowire film. See FIGS. 6B and 6C.

Figure 7:
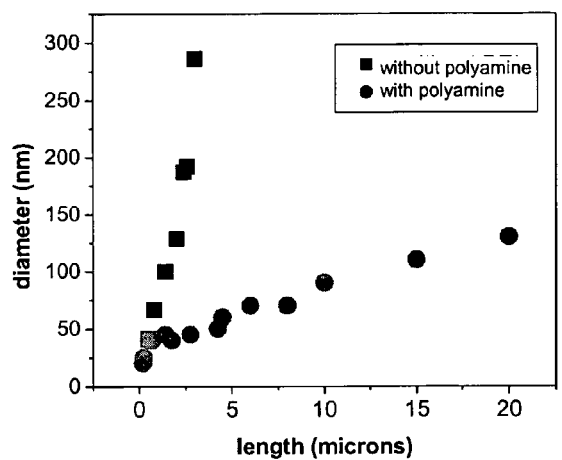
FIG. 7 shows a graph of nanowire diameter vs. length. The effect of using and not using polyethylenimine (PEI) is illustrated.

FIG. 7 shows a graph, which correlates nanowire length and diameter at different growth times with and without PEI addition. The longest arrays presented have nanowires with lengths exceeding ~20 μm. As shown in FIG. 7, when PEI (or other polyamine) is used, a two, three, or fourfold increase in the lengths of the nanowires can be achieved, as compared to embodiments that do not use PEI.

Figures 8A, 8B:
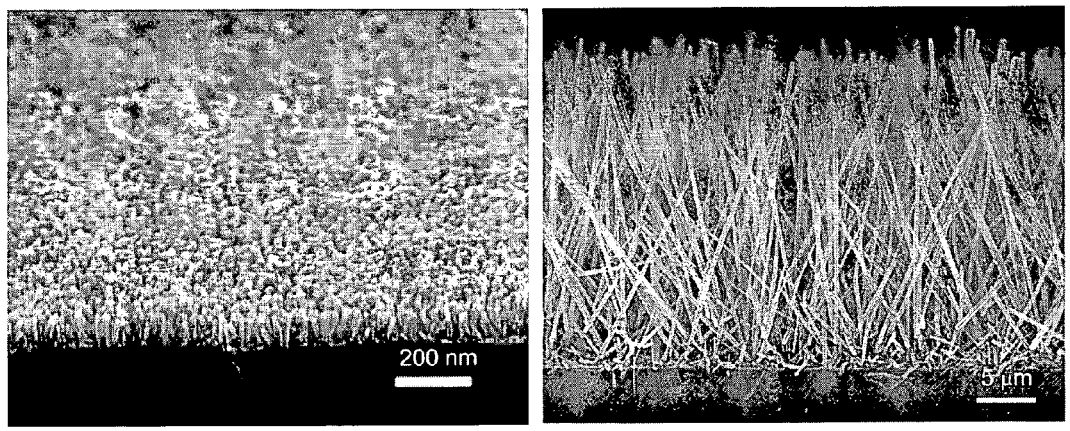
FIG. 8A shows a nanowire array on a substrate for exemplary use in an organic-inorganic hybrid photovoltaic device. The nominal aspect ratio is about ten. The scale bar is 200 nanometers.
FIG. 8B shows a nanowire array on a substrate for exemplary use in a DSC or dye sensitized cell. The nominal aspect ratio is greater than about 120. The scale bar is 5 microns.

FIG. 8A shows a nanowire array for an organic-inorganic hybrid cell (or device) where the nanowires have aspect ratios of about 10 (formed without a polyamine). The array could also be formed with a polyamine.

FIG. 8B shows a nanowire array for a DSC where the nanowires have aspect ratios of about 120 or more (formed with a polyamine).

Once a nanowire array has been formed on a substrate, an optoelectronic device such as a photovoltaic device may be formed. Such devices are described in further detail above and below.

II. Optoelectronic Devices Including the Nanowire Arrays

Other embodiments of the invention are directed to an optoelectronic devices. As used herein, optoelectronic devices include devices that can either produce light or can convert light to electricity. They may include a first conductive layer, a second conductive layer, an array of semiconductor nanowires (with or without nanobranches) between the first and second conductive layers, and a charge transport medium between the first and second conductive layers. Such optoelectronic devices may include DSCs, organic-inorganic hybrid photovoltaic devices, solid-state sensitized solar cells, and light emitting diodes. Details of these and other devices are provided below.

The charge transport medium that is used depends on the type of optoelectronic device that is produced. For example, the charge transport medium in a DSC may comprise an electrolyte. By comparison, an electrolyte may not be present in an organic-inorganic hybrid photovoltaic device. In embodiments of the invention, the charge transport medium may fill or impregnate the spaces between the nanowires to form a wire composite. In some embodiments of the invention, the wire composite may include 5-95% by volume of the charge transport medium and/or 9-95% by volume of the nanowires.

The nanowire arrays in the optoelectronic devices can be formed using any of the solution processes described above (and below). In other embodiments, the nanowire arrays may be formed using vapor phase processes. Vapor-phase processes are described in Yang et al. and generally require high temperatures. Yang et al., *Adv. Func. Mater.*, 12:323 (2002); Yao et al., *Appl. Phys. Lett.*, 81:757 (2002). Accordingly, the solution based processes described herein are preferred.

A. DSCs (Dye Sensitized Cells)

The DSC is currently the most efficient and stable excitonic photocell. Central to this device is a thick nanoparticle film that provides a large surface area (roughness factor ~1000) for light harvesting. However, nanoparticle DSCs rely on trap-limited diffusion for electron transport, a slow mechanism that can limit device efficiency, especially at longer wavelengths.

In a conventional DSC, the anodes are typically constructed using thick films (~10 μm) of $TiO_2$ or, less often, ZnO nanoparticles that are deposited as a paste and sintered to produce electrical continuity. The nanoparticle film provides a large internal surface area for the anchoring of sufficient chromophore (usually a ruthenium-based dye) to yield high light absorption in the 400-800 nanometer region, where much of the solar flux is incident. The chromophore may be in the form of a dye monolayer. In operating cells, photons intercepted by the dye monolayer create excitons that are rapidly split at the nanoparticle surface, with electrons injected into the nanoparticle film and holes exiting the opposite side of the device via redox species (traditionally the $I^-/I_3^-$ couple) in a liquid or solid-state electrolyte.

The nature of electron transport in oxide nanoparticle films is now well studied. Time-resolved photocurrent and photovoltage measurements and modeling efforts indicate that electron transport in wet, illuminated nanoparticle networks occurs by a trap-limited diffusion process in which photogenerated electrons are repeatedly captured and expelled by an exponential distribution of traps as they undertake a random walk through the film. Drift transport (which is a mechanism in most photovoltaic cells), is prevented in DSCs by ions in the electrolyte that screen all macroscopic electric fields and couple strongly with the moving electrons, effectively rendering them neutral carriers (i.e., ambipolar diffusion). Under normal solar light levels, an injected electron is thought to experience an average of a million trapping events before either percolating to the collecting electrode or recombining with an oxidizing species (principally $I_3^-$ in the electrolyte). Transit times for electron escape from the film are as long as a second. Despite the extremely slow nature of such trap-mediated transport (characterized by an electron diffusivity, $D_n \leq 10^{-4}$ $cm^2\ s^{-1}$, many orders of magnitude smaller than in $TiO_2$ or ZnO single crystals), electron collection remains favored vis-à-vis recombination due to the even slower multi-electron kinetics of $I_3^-$ reduction on oxide surfaces. Electron diffusion lengths of 10-30 μm have been reported for cells operating at light intensities up to 0.1 Sun. This is strong evidence that electron collection is highly efficient for the 10 μm-thick nanoparticle films normally used in devices. The surprising success of the DSC results from this balance between sluggish transport in the anode and the ultra low recombination rate of electrons with $I_3^-$. The slow recombination is itself partly due to the excellent electrostatic screening provided by the liquid electrolyte.

One can gain insight into the factors that limit DSC performance by comparing the theoretical cell efficiencies with those of current state-of-the-art cells. The power conversion efficiency of a solar cell is given as $\eta=(FF|J_{sc}|V_{oc})/P_{in}$, where FF is the fill factor, $J_{sc}$ is the current density at short circuit, $V_{oc}$ is the photovoltage at open circuit and $P_{in}$ is the incident light power density. In principle, the maximum $J_{sc}$ of a DSC is determined by how well the absorption window of its dye sensitizer overlaps the solar spectrum. Record cells achieve currents (and overall efficiencies) that are between 55-75% of their theoretical maxima at full Sun, depending on the dye used. Much of the shortfall is due to the poor absorption of low energy photons by available dyes. The development of better dyes and light-trapping schemes has received significant attention in this regard, so far with little success. A second method of improving the absorption of red and near-IR light is by thickening the nanoparticle film to increase its optical density. This yields diminishing returns as the film thickness approaches and exceeds the electron diffusion length through the nanoparticle network.

One promising solution to the above impasse is to increase the electron diffusion length in the anode by replacing the nanoparticle film with an array of oriented single-crystalline nanowires. Electron transport in crystalline wires is expected to be several orders of magnitude faster than percolation in a random polycrystalline network. By using dense arrays of long, thin nanowires, one should be able to improve the dye loading (and so the absorption of red light) while maintaining the excellent carrier collection characteristics of traditional nanoparticle DSCs. Moreover, the rapid transport provided by a nanowire anode would be particularly favorable for DSC designs that use non-standard electrolytes, such as polymer gels or solid inorganic phases, in which recombination rates are high compared to the liquid electrolyte cell.

To act as an efficient DSC photoanode, a nanowire film preferably has a large surface area for dye adsorption, comparable to that of its nanoparticle analogue. In embodiments of the invention, high surface area ZnO nanowire arrays were made in aqueous solution using a seeded growth process that was modified to yield long wires (as described above). Briefly, a thin (<15 nanometer) layer of ZnO quantum dots (nanocrystals) was deposited on a surface by dip coating, and wires were grown from these nuclei via the thermal decomposition of a zinc amino complex (as described above). The overall process is a simple, low temperature and environmentally benign route to forming dense arrays (up to 40 billion wires per $cm^2$) on arbitrary substrates of any size. Past reports of solution-grown ZnO nanowires have been limited to lengths that are too small for use in efficient DSCs.

ZnO nanowire films are good electrical conductors perpendicular to the substrate plane (that is, along the wire axes). Two-point electrical measurements of dry arrays on $SnO_2$:F coated glass give linear I-V traces that indicate barrier-free nanowire/substrate contacts. Individual nanowires were extracted from the arrays, fashioned into field-effect transistors (FETs) using standard electron-beam lithography procedures, and analyzed to extract their resistivity, carrier concentration and mobility. Measured resistivity values ranged from 0.3-2.0 Ωcm, falling on the conductive end of the spectrum for nominally undoped ZnO. A moderately high electron concentration of $5\times10^{18}$ cm$^{-3}$ and mobility of 1-5 cm$^2$ V$^{-1}$ s$^{-1}$ were estimated from transconductance data. Using the Einstein relation, $D=k_BT\mu/e$, the present inventors calculated an electron diffusivity $D_n=0.05-0.5$ cm$^2$s$^{-1}$ for single dry nanowires. This value is 500 times larger than the best diffusivity for TiO$_2$ or ZnO nanoparticle films in operating cells. Faster diffusion in nanowires is a consequence of their excellent crystallinity and complete lack of grain boundaries, as confirmed by transmission electron microscopy (not shown).

A DSC cell according to an embodiment of this invention includes an optimized nanowire array deposited on conductive glass. A monolayer of dye molecules is formed on the nanowire array. For example, a dye may be adsorbed on the nanowire array using a vapor phase or a liquid phase coating process. Suitable dyes include ruthenium based dyes including [(CN)(bpy)$_2$Ru—CN—Ru(dcbpy)$_2$-NCRu(bpy)$_2$], [Ru(4,4-bis(carboxy)-bpy)$_2$(NCS)$_2$] and [Ru(2,2',2"-(COOH)$_3$-terpy)(NCS)3]. Other commercially available dyes may be used instead.

The nanowires may comprise any of the materials or characteristics mentioned above. For example, the nanowires may comprise zinc oxide, titanium oxide, tin oxide, core/shell nanowires (e.g., titanium oxide on zinc oxide), or any other suitable semiconductor material in any suitable configuration.

After it is formed, the one half of the cell that includes the nanowires is then sandwiched together with a counter-electrode (e.g., conductive glass coated with thermalized platinum particles) using a hot-melt polymer spacer (or other type of spacer). The interior space is then filled with an electrolyte solution such as an I$^-$/I$_3^-$ redox couple in a nitrile-based solvent. Other types of electrolyte solutions are known to those of skill in the art and can be used in embodiments of the invention. The electrolyte may alternatively be a polymer gel. In addition, the substrates could alternatively be conductive plastic, instead of coated, conductive glass.

FIG. 9A shows a conventional nanoparticle DSC 30. As illustrated, a number of semiconductor particles are present between the two electrodes.

FIG. 9B shows a DSC 20 according to an embodiment of the invention. The DSC 20 includes a first conductive substrate 10 including an (fluorine doped F:SnO2) SnO$_2$ electrode, and a second conductive substrate 14 including an (fluorine doped F:SnO2) SnO$_2$ electrode with a Pt mirror. In between the first and second conductive substrates 10, 14, is an array of nanowires 12 with a dye coating. A liquid electrolyte 18 is between the nanowires in the array and is also between the first and second conductive substrates 10, 14.

FIG. 10 shows a graph of current density (mA cm$^{-2}$) vs. bias voltage (V) for a DSC. A roughness factor =200. It shows characteristics of a DSC solar cell showing 1.5% efficiency under 100 mW/cm$^2$ of simulated sunlight.

Figure 11:
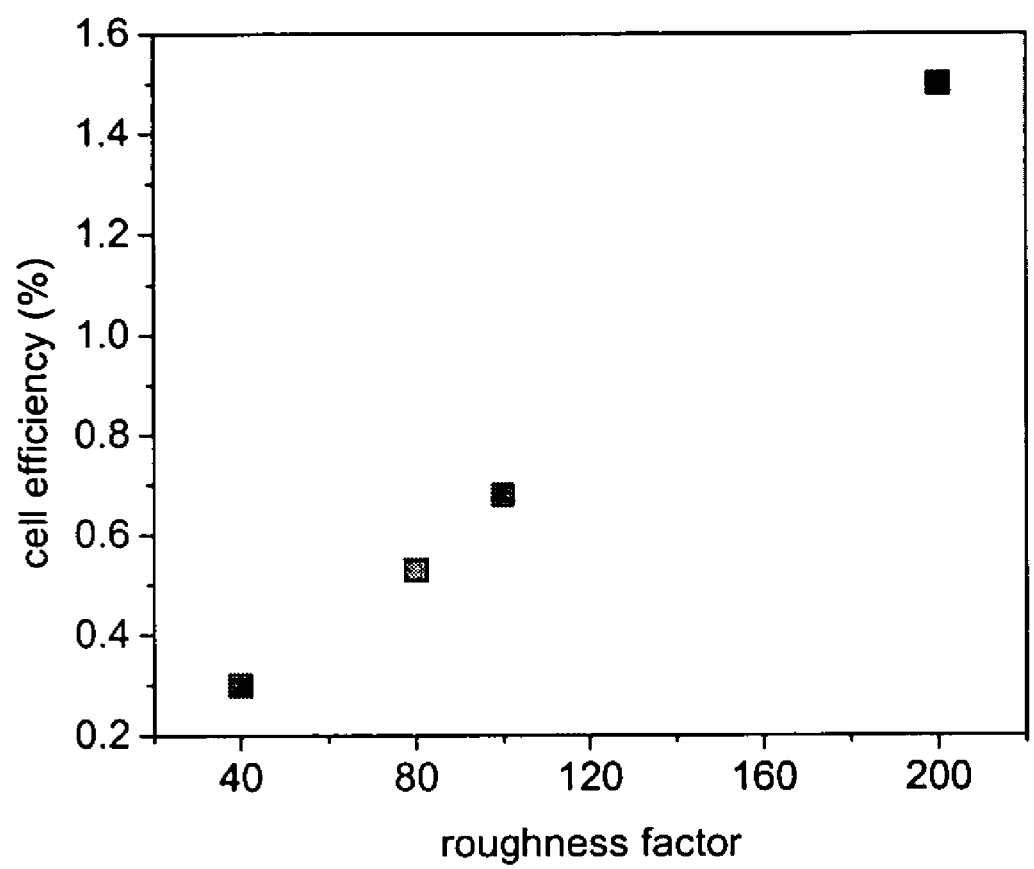
FIG. 11 shows a graph of cell efficiency vs. roughness factor.

FIG. 11 is a graph of cell efficiency vs. roughness factor. It shows that a larger surface area will improve efficiency. "Roughness factor" is unit-less and is the surface area of a sample per geometric area of the substrate.

B. Organic-Inorganic Hybrid Photovoltaic Devices

Embodiments of the invention can also include organic-inorganic hybrid cells. Currently, to separate the donor and acceptor materials in such cells (or devices), a spin cast method is used. However, this creates a disordered film morphology, which causes poor transport properties in the cells. The use of nanowires provides an ordered bulk interface with a direct pathway to the electrode, thus reducing poor transport properties and improving the performance of the cell.

The organic-inorganic hybrid photovoltaic cells according to embodiments of the invention are particularly promising for efficient excitonic photoconversion. In these devices, an array of thin (about 20-30 nanometers in diameter), short (about 100-300 nanometers tall) nanowires may be intimately wetted with a conducting or semiconducting polymer (e.g., P3HT) that penetrates into the spaces (e.g., 10-50 nanometer spaces) between the wires. The polymer acts as both a light-harvesting and a hole conducting material. Electrons are captured by the ZnO wires and are transported to the anode. The device includes the organic-inorganic composite sandwiched between two electrodes.

The dense nanowire arrays according to embodiments of the invention have high surface area and pore spaces large enough to form a high-quality junction with the polymer layer. The nanowires contact the electrode directly and provide an excellent current pathway.

Figure 12:
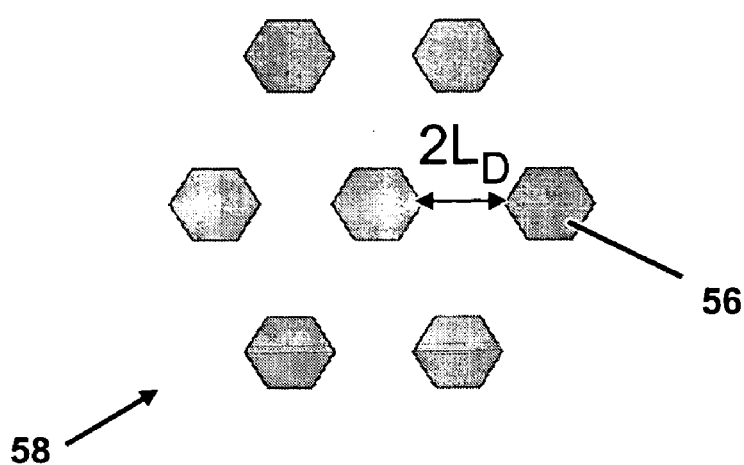
FIG. 12 shows a schematic top view of nanowires in an array.

FIG. 12 shows a schematic view of an array of nanowires from a top view. $2L_D$ represents the spacing between adjacent nanowires and may be 20 nanometers in some embodiments. $L_D$ is the exciton diffusion length. In order for the device to efficiently split the exciton at a polymer-semiconductor interface by not having the electron-hole pair recombine, the spacing between the semiconductor wires should be ideally less than $2L_D$.

Figure 13:
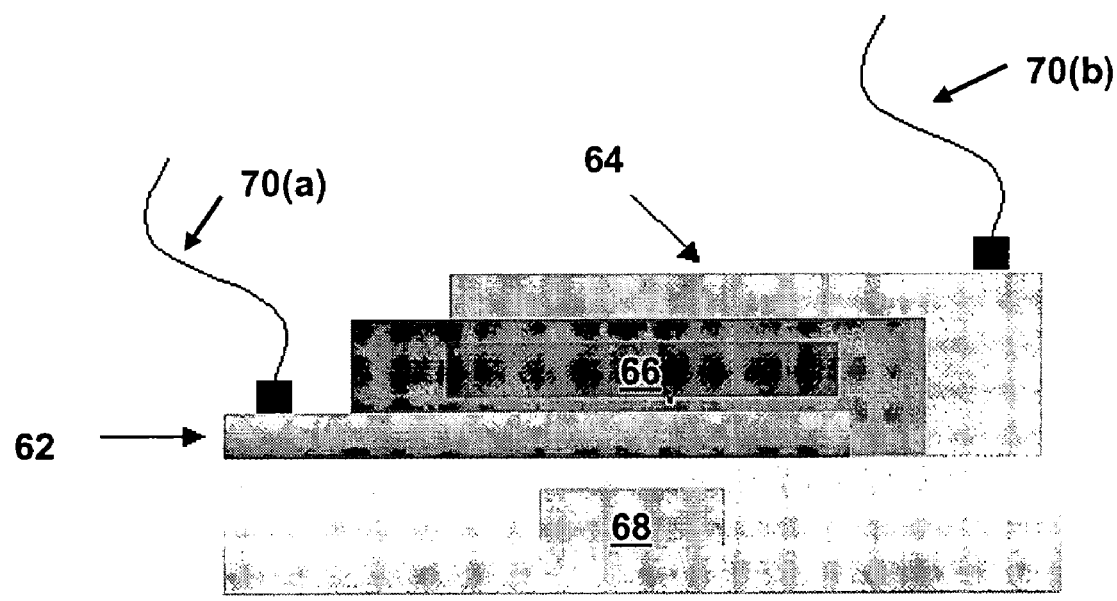
FIG. 13 shows a schematic cross-sectional view of an organic-inorganic hybrid cell according to an embodiment of the invention.

FIG. 13 shows a schematic illustration of an organic-inorganic hybrid cell according to an embodiment of the invention. The cell includes a first conductive layer 62, which comprises a transparent or translucent material to allow for the passage of light, and a second conductive layer 64. The second conductive layer 64 may comprises a reflective, conductive material such as gold or silver (or alloys thereof). Alternatively, the second conductive layer 64 may comprise a transparent or translucent material. A reflective film may on the transparent or translucent second conductive layer 64. By providing a second conductive layer 64 that has some reflective characteristics, light that passes through the first conductive layer 62 and a wire composite 66 between the first conductive layer 62 and the second conductive layer 64 is reflected back to the wire composite 66, thereby maximizing the transmission of light to the wire composite 66. Illustratively, the first conductive layer 62 may comprise ITO, while the second conductive layer 64 may comprise gold or silver. A transparent or translucent substrate 68 may support the second conductive layer 64. The substrate 68 may comprise a rigid material such as glass. Electrical connections 70(a), 70(b) may be provided to the first and second conductive layers 62, 64.

The wire composite 66 is between the first conductive layer 62 and the second conductive layer 64. The wire composite 66 comprises any of the nanowire arrays described herein in combination with an electrically conductive or semiconducting polymer.

The phrase "semiconducting polymer" includes all conjugated polymers having a pi-electron system. Non-limiting examples of semiconducting polymers include trans-polyacetylene, polypyrrole, polythiophene, polyaniline, poly (p-phenylene and poly(p-phenylene-vinylene), polyfluorenes, polyaromatic amines, poly(thienylene-vinylene)s and soluble derivatives of the above. An example is (poly(2- methoxy,5-(2'-ethylhexyloxy)$_p$-phenylenevinylene) (MEH-PPV) and poly(3-alkylthiophene) (e.g., poly(3-hexylthiophene) or P3HT). Some embodiments of the invention can also use conjugated polymers that are either solution processable or melt processable, because of bulk pendant groups attached to the main conjugated chain or by its inclusion of the conjugated polymer into a copolymer structure of which one or more components are non-conjugated. Non-limiting examples include poly(4'-diphenylenediphenylvinylene), poly(1,4-phenylene-1-phenylvinylene and poly(1,4-phenylenediphenylvinylene, poly(3-alkylpyrrole) and poly(2,5-dialkoxy-p-phenylenevinylene). It is understood that the term "semiconducting conjugated polymer" could include a mixture or blend of polymers, one of which is to be a semiconducting conjugated polymer.

The cell shown in FIG. 13 can be used in any suitable manner. For example, in some embodiments, light passes through the substrate 68 and the second conductive layer 64 and irradiates the wire composite 66 comprising the nanowire array. This, in turn, induces current flow through the electrical connections 70(a), 70(b).

The cell shown in FIG. 13 can be made in any suitable manner. For example, in one embodiment, one may coat the substrate 68 with the first conductive layer 62 using a conventional coating process such as vapor deposition, electroplating, electroless plating, etc. After obtaining the coated conductive substrate, an array of nanowires can be grown on the first conductive layer 62 in the manner described herein. Then, a conductive or semiconductive polymer may be deposited on the array of nanowires, and can fill the spaces between the nanowires. The polymer may be deposited on the array of nanowires using any suitable process including roller blade coating, surface initiated polymerization, dip coating, spin coating, vapor deposition, etc. After forming the wire composite 66, the second conductive layer 64 can be formed on the wire composite 66. The second conductive layer 64 can be formed using the same or different process as the first conductive layer 62. Then, the electrical connections 70(a), 70(b) can be attached to the first and second conductive layers 62, 64.

The structure shown in FIG. 13 can be produced by other processes. In another example, the wire composite 66 can be formed first, and then the substrate 68 and the first and second conductive layers 62, 64 can be laminated together. Once they are laminated together, the electrical connections can be attached to the first and second conductive layers 62, 64.

Figure 14:
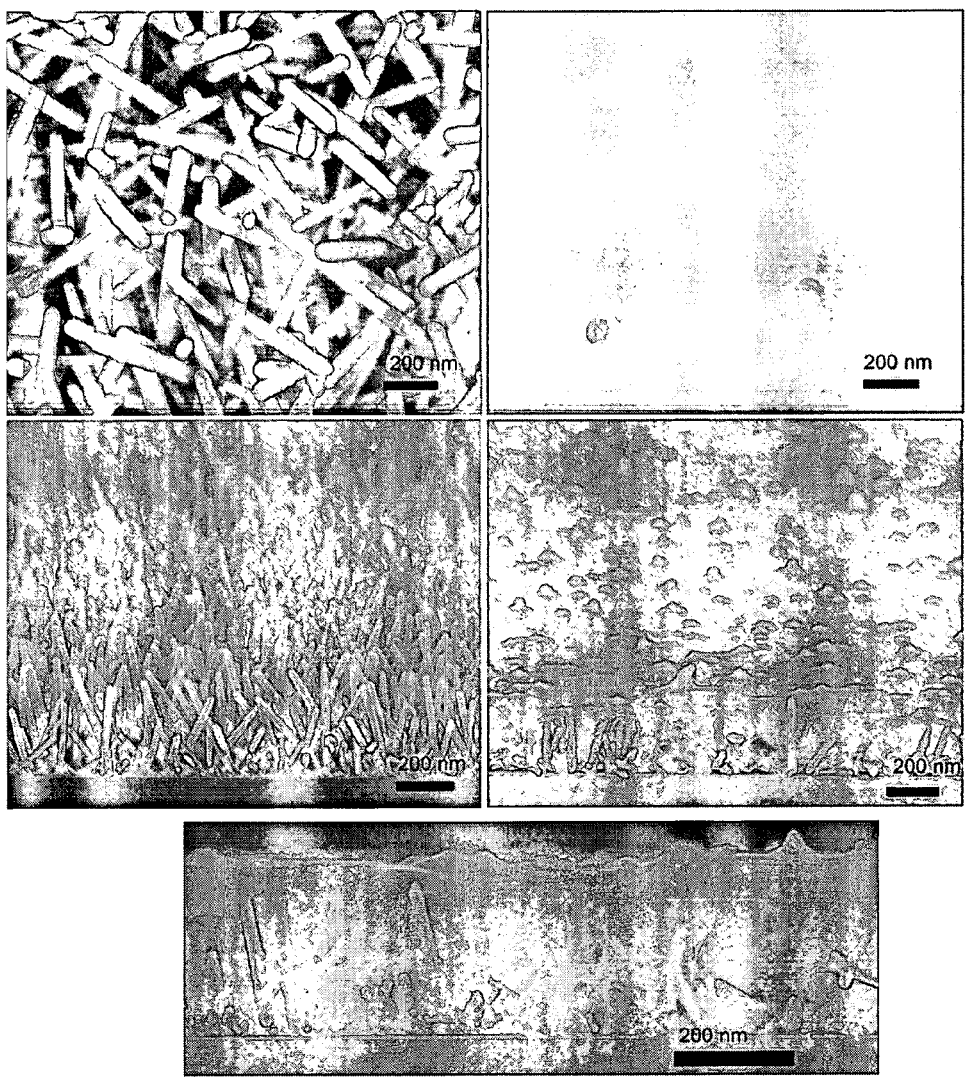
FIG. 14 shows various views of wire composites according to embodiments of the invention.

FIG. 14 shows SEM photographs of actual wire composites including nanowire arrays and a polymeric material.

Figure 15:
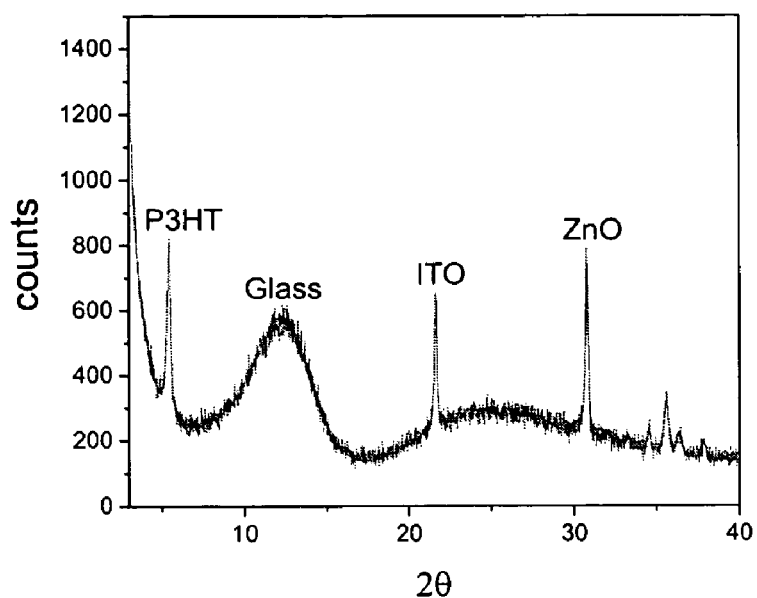
FIG. 15 is an x-ray diffraction graph.

FIG. 15 is an x-ray diffraction plot associated with an organic-inorganic hybrid cell including a wire composite including a zinc oxide nanowire array and P3HT (poly(3-hexylthiophene)), an ITO conductive layer, and glass. As shown in FIG. 15, P3HT retains its crystalline domains, therefore maintaining high mobility.

Figure 16:
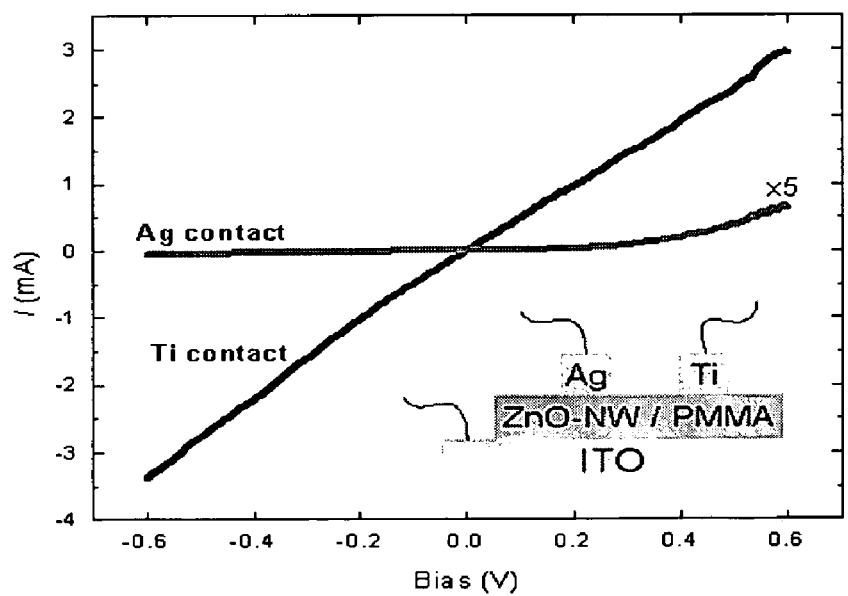
FIG. 16 shows the bias/current relationship in accordance an embodiment of the invention.

FIG. 16 shows electrical characteristics for a single ZnO nanowire. I-V curves at various gate biases for a nanowire with a diameter of 75 nm, showing n-type behaviour and a resistivity of 0.65 Ωcm. The left inset shows the corresponding $I_{SD}$-$V_G$ curve at $V_{SD}$=100 mV. The ON-OFF ratio is $10^5$ at 50 volts. The right inset shows an SEM image of the ZnO NW-FET.

C. Solid State Sensitized Solar Cells

Solid state sensitized solar cells are also referred to as dye-sensitized heterojunctions (DSHs). These have a structure similar to the DSCs described above, but in a DSH, a light absorbing dye is placed at an n-p heterojunction. DSHs without nanowire arrays are described in Regan, et al., "A solid-state dye-sensitized solar cell fabricated with pressure-treated P25-TiO$_2$ and CuSCN: analysis of pore filling and IV characteristics", Chemistry of Materials 14 (12): 5023-5029 (January 2003), which is herein incorporated by reference in its entirety.

Figure 17:
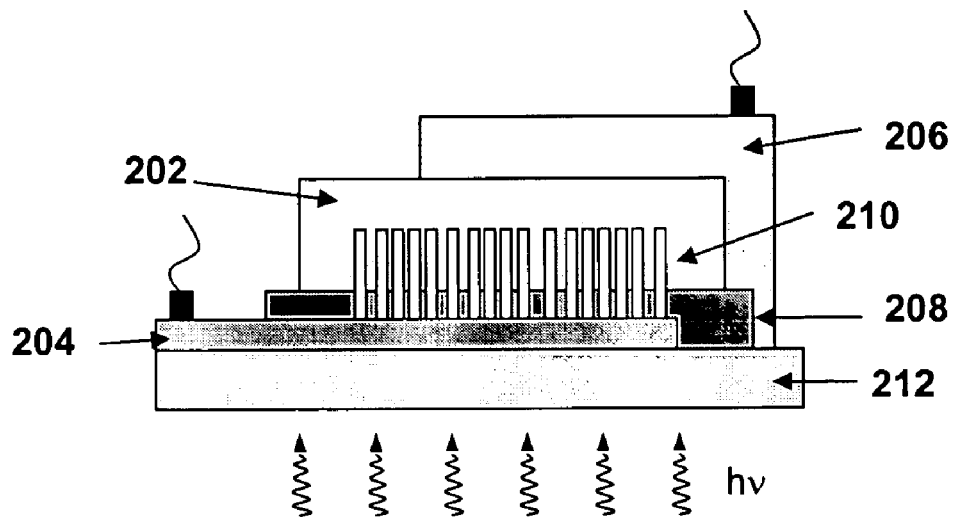
FIG. 17 shows a schematic cross-sectional view of a solid state sensitized cell with a nanowire array.

FIG. 17 shows a solid state sensitized solar cell with a nanowire electrode. It includes a substrate 212 and a first conductive layer 204 on the substrate. A second conductive layer 206 in the form of a metal contact is on a solid-state semiconductor material such as a p-type solid-state semiconductor 202. Any suitable p-type semiconductor may be used. For example, a p-type semiconductor such as CuI or CuSCN may be used. It may alternatively be an amorphous organic hole transmitting material. The solid state semiconductor material 202, an electron blocking layer 208 and a nanowire array 210 are between the first conductive layer 204 and the second conductive layer 206. The nanowire array 210 may comprise ZnO or any of the materials mentioned above, and may be coated with a dye (not shown). An electron blocking material such as AlGaN can be used for the electron blocking layer 208. The electron blocking layer 208 improves the efficiency of the device. The semiconductor material 202 fills the spaces between the nanowires in the nanowire array 210.

The solid state sensitized cell shown in FIG. 17 has a construction similar to the previously described cells, except that an electron blocking layer is present. The same processes and materials that are described above with respect to the DSC and the hybrid cell can be used to construct the cell shown in FIG. 17. For example, the semiconductor material 202 may be deposited on the nanowire array 210 using conventional coating processes. The The blocking layer 208, if present, may be formed on the substrate 212 by any suitable known coating process such as a vapor phase coating process (e.g., sputtering and CVD).

D. Light Emitting Diodes

Embodiments of the invention can also be used to produced LEDs or light emitting diodes.

Figure 18:
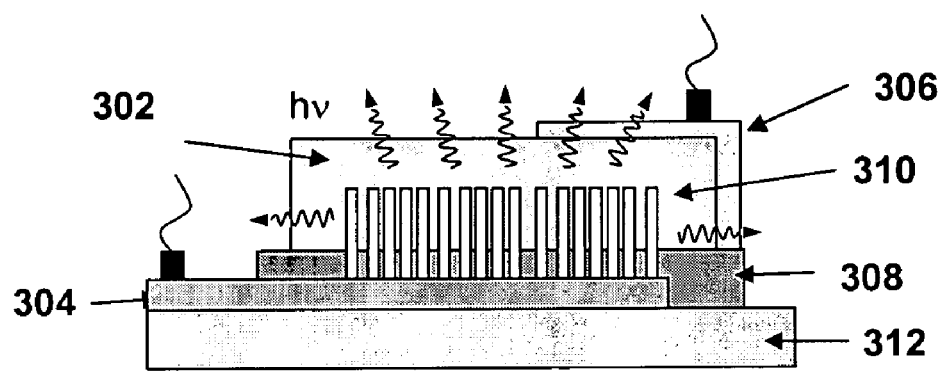
FIG. 18 shows a cross-sectional view of a light emitting diode with a nanowire array.

FIG. 18 shows a light emitting diode according to an embodiment of the invention. It includes a substrate 312 and first conductive layer 304 on the substrate. A second conductive layer 306 in the form of a metal contact is on a solid state semiconductor material such as a p-type solid state semiconductor 302. Any suitable p-type semiconductor may be used. For example, a p-type semiconductor such as CuI or CuSCN may be used. The solid state semiconductor material 302, an electron blocking layer 308 and a nanowire array 310 comprising an n-type semiconductor such as ZnO are between the first conductive layer 304 and the second conductive layer 306. An electron blocking material such as AlGaN can be used. The semiconductor material 302 fills the spaces between the nanowires in the nanowire array 310.

As is known in the art, when an electrical bias is provided to a p-n junction, the recombination of electron-hole pairs injected into a depletion region causes the emission of electromagnetic radiation. Accordingly, the device shown in FIG. 18 may be coupled to a power source (not shown) to provide the electrical bias to the p-n junction formed at the nanowire 310/semiconductor material 302 interface.

The LED has a construction similar to the previously described cells, except that a dye need not be present. The same processes and materials that are described above with respect to the other cells and devices may be used to construct the device shown in FIG. 18.

III. Branched Networks Including Nanowires

Many of the above-described embodiments include an array of nanowires without branches. Other embodiments of the invention are directed to nanowire arrays including branches. These may be used to form a three-dimensional network on a substrate.

Figure 19:
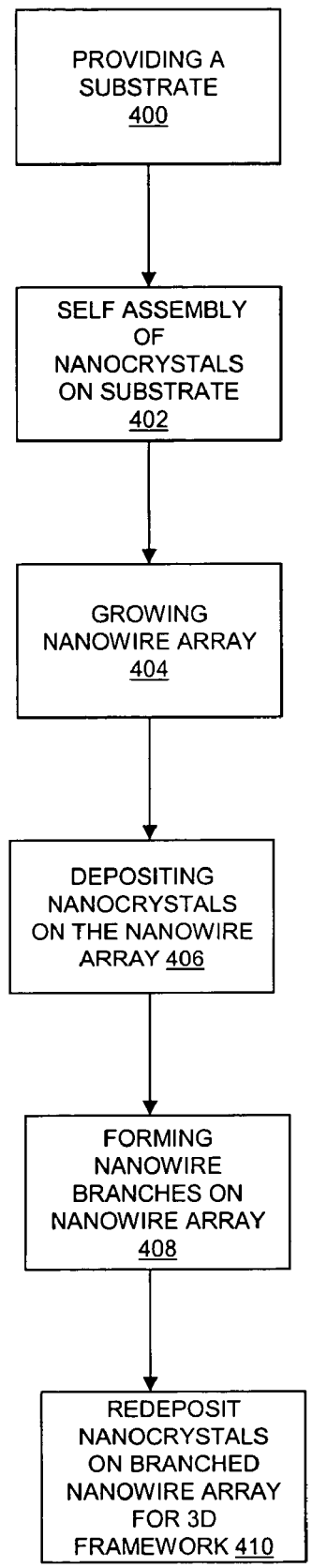
FIG. 19 shows a flowchart illustrating a method according to another embodiment of the invention.

FIG. 19 shows an exemplary flowchart illustrating a method according to an embodiment of the invention. As shown there, a substrate is provided (step 400). Nanocrystals are then deposited on the substrate, preferably through a self assembly process (step 402). After depositing the nanocrystals on the substrate, a solution then contacts the deposited nanocrystals. After the solution contacts the deposited nanocrystals, an array of nanowires is formed (step 404). Process steps 400, 402, and 404 and other suitable process steps are already described above.

After forming an array of nanowires on a substrate, the array of nanowires and substrate can be removed from the solution and dried. Additional nanocrystals are deposited on the nanowire array (step 406). After depositing the nanocrystals on the nanowire array, they can be contacted with the solution (as previously described) and branches can form from the deposited nanocrystals while in the solution (step 408). The process that is used to form the nanobranches on the nanowires may be the same or different process that is used to form the nanowires themselves. Nanowire formation processes are described in detail above and below, and the details of those process are incorporated in this discussion of forming nanobranches. This nanobranch formation process can be repeated as often as desired to form branches on the previously formed branches to form a three-dimensional network of branched nanowires (step 410). It is understood that any of the process steps described above with respect to the formation of the nanowire arrays can be used to form the nanobranches.

Figure 20:
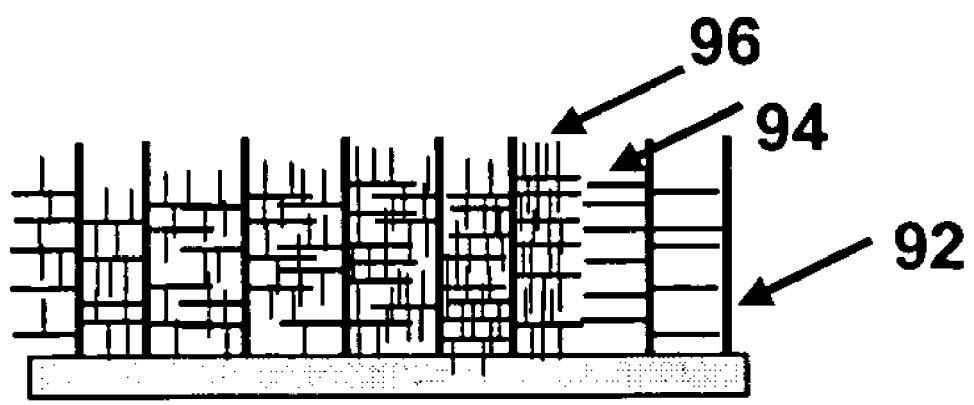
FIG. 20 shows a schematic illustration of a branched network on a substrate.

FIG. 20 shows a schematic illustration of another three-dimensional network 80 of branched nanowires. First, the nanowires 92 are grown on the illustrated substrate. Then, a first set of nanobranches 94 is formed on the nanowires. Then, a second set of nanobranches 96 can be formed on the first set of nanobranches and/or the nanowires 92. Additional sets of nanobranches can be formed after that.

The branched nanowire arrays according to embodiments of the invention have a high surface area. This is particularly desirable. For example, a photovoltaic cell with a nanowire array with a higher surface area generally has a better energy conversion efficiency than a photovoltaic cell with a nanowire array with a lower surface area.

Some additional examples are provided below.

IV. EXAMPLES

A. Nanowire Characterization

Nanowire arrays were formed according to the solution based processes mentioned above (without polyethylenimine). U.S. Provisional Patent Application No. 60/480,256, filed on Jun. 20, 2003, which is herein incorporated by reference, provides further details on these and other examples.

The ultraviolet and visible photoluminescence (PL) of as-grown nanowire arrays was measured in the temperature range $4.5 \leq T \leq 300$ K using a low-power, unfocused 325 nm line of a He—Cd laser as the excitation source. Room temperature spectra of as-grown samples showed a weak band edge emission at 378 nm (3.29 eV), due to free exciton annihilation, and a very strong and broad yellow-orange emission that is fit well by two Gaussians, with a major peak centered at 605 nm (2.05 eV) and a shoulder at 730 nm (1.70 eV). The three peaks grow more intense with decreasing temperature as a result of the freeze-out of phonons and quenching of nonradiative recombination processes. A 90 meV blueshift of the band-edge emission over this temperature range was caused by the thermal contraction of the lattice and changing electron-phonon interactions (Zhang et al., *J. Lumin.*, 99:149 (2002)). The temperature dependence of the orange (2.05 eV) photoluminescence intensity can be expressed by a simple thermal activation model of the form (Jiang et al., *J. Appl. Phys.*, 64:1371 (1988)), $$I = I_o/(1 + A^* \exp(-E_A/k_B T)). \tag{1}$$

By fitting the experimental data, an activation energy $E_A = 71$ meV was obtained for the nonradiative mechanisms responsible for quenching the orange luminescence. This value is almost three times greater than the energy reported in a previous study of single crystal and powder samples (Lauer, *J. Phys. Chem. Solids*, 34:249 (1973)).

It is known that pure ZnO can show green and/or orange visible luminescence depending on the growth temperature and availability of oxygen during sample preparation (Zelikin et al., *Optika i Spektroskopiya*, 11:397 (1961); Bhushan et al., *Indian J. Pure & Appl. Phys.*, 19:694 (1981)). The green emission is due to the recombination of electrons with holes trapped in singly-ionized oxygen vacancies ($V_o^+$) and is commonly seen in ZnO materials synthesized under oxygen deficient conditions, including the gas-phase nanowires produced (van Dijken et al., *J. Lumin.*, 90:123 (2000)). Orange photoluminescence has been seen in ZnO grown electrochemically (Zheng et al., *Chem. Phys. Lett.*, 363:123 (2002)), hydrothermally (Sekiguchi et al., *J. Crystal Growth*, 214/215:72 (2000)), and via pulsed laser deposition (Wu et al., *Appl. Phys. Lett.*, 78:2285 (2001)) and spray pyrolysis (Studenikin et al., *J. Appl. Phys.*, 84:2287 (1998)). The strong orange PL and complete absence of green emission from the aqueous-grown nanowire arrays is consistent with the above assignments. Regardless of the exact origin of the orange emission, the large ratio of orange PL intensity to band-edge PL intensity indicates that the as-grown nanowires are rich in defects, which is typical for crystals grown in solution.

Photoluminescence and lasing measurements were combined with a series of annealing treatments in order to investigate the nature of the orange emission. Three samples were cut from both a 1.5-hour nanowire array and a 3-hour nanowire array on silicon. The samples were then annealed in one of three environments, either 400° C. in 10% $H_2$/90% Ar for 15 minutes, 500° C. in 10% $H_2$/90% Ar for 15 minutes, or 800° C. in a $5 \times 10^{-6}$ Torr vacuum for 2 hours. One sample from each wafer was left untreated as a control. Post-anneal SEM imaging of each sample confirmed that the nanowires survived the annealing processes and were visibly undamaged, except for a slight surface etching seen in the 500° C. $H_2$ treatments. Room temperature photoluminescence spectra of the 1.5-hour samples showed a progressive quenching of the orange emission with a simultaneous increase of the band-edge PL intensity. The marked weakening of the orange emission after vacuum annealing is consistent with the involvement of oxygen interstitials in the luminescence. The 500° C. $H_2$ treatment caused a nearly complete quenching of the orange PL and resulted in a spectrum dominated by band-edge emission. The green PL feature, which should develop with sufficiently reducing treatments, (Studenikin et al., *J. Appl. Phys.*, 84:2287

(1998)) was not observed even in a sample that was exposed to hydrogen at 600° C. and appeared heavily etched by SEM.

The lasing behavior of the eight array samples was investigated by far-field photoluminescence imaging using an experimental setup described previously (Johnson et al., *Nature Materials*, 1:101 (2002)). Neither of the as-grown samples showed lasing at sub-ablation pumping intensities. Lasing of array nanowires on the annealed 1.5-hour samples was observed in only a small fraction of the wires, likely those at the upper limit of the diameter distribution having a sufficient cavity finesse to support a single lasing mode. The annealed 3-hour samples (average diameter d=125 nm, length 2 µM) showed lasing in roughly ten times the number of wires as the 1.5-hour arrays (average diameter 60 nm, length 1.5 µm), which is reasonable since optical gain in a nanowire scales exponentially with the cavity length and decreases with d<λ, due to diffraction effects. A typical PL spectrum of a 3-hour solution array above threshold showed several relatively sharp lasing peaks superimposed on a broad PL background. However, the percentage of lasing wires in the 3-hour arrays remained very low, probably because their short lengths lead to high gain thresholds. A comparison of the average lasing thresholds for the active wires on the three annealed solution-grown arrays and a gas-phase array showed that the threshold tends to decrease as the ratio of ultraviolet PL to visible PL increases, with the gas-phase array lasing at one-fifth the threshold of the most reduced 3-hour sample. Annealing as-grown arrays in reducing atmospheres quenches the intense orange emission and lowers the lasing threshold of the larger nanowires to values similar to gas-phase samples.

B. Nanowires Formed Using Polyethylenimine

Synthesis of ZnO Nanowire Photoanodes: ZnO nanowire arrays were synthesized on ITO-coated glass substrates (10 Ω/sq, Thin Film Devices, Inc.) and/or fluorine doped $SnO_2$ (7-8 Ω/sq, Hartford Glass) using a modified version of a published approach. After sonication cleaning in acetone/ethanol and 1.0 M HCl, the substrates were manually dip-coated in a solution of ZnO quantum dots in ethanol, rinsed with ethanol and dried in a stream of gas. This procedure reliably formed a dense layer of nanoparticle seeds on the surface. Nanowire arrays were then grown in aqueous solutions containing 20-60 mM zinc nitrate hexahydrate, 25-50 mM hexamethylenetetramine and 0.5-5 mM polyethylenimine (branched, low molecular weight, Aldrich) at 90-95° C. for 2-5 hours. Since nanowire growth ceased after this period, substrates were repeatedly introduced to fresh solution baths in order to attain long wires and high surface areas (total reaction times of 15-25 hrs). The array electrodes were then rinsed with deionized water and baked in air at 400° C. for 1 hour to remove any residual polymer.

Using polyethylenimine (PEI) in the solution, the aspect ratios of the nanowires increased to above 120. The dramatic effect of this molecule in solution can be seen in FIGS. 7, 8A, and 8B. FIG. 7 correlates nanowire length and diameter at different growth times with and without PEI addition.

Electrical measurements: For the single wire studies, 8-10 µm long ZnO nanowires were dispersed from solution onto oxidized silicon substrates (300 nm $SiO_x$) and fired in air at 400° C. for 15 minutes. Electron-beam lithography was used to pattern and deposit 100 nm thick Ti contacts from the wires to prefabricated contact pads. Many devices showed ohmic I-V plots without further heat treatment. Measurements were performed with a global back gate using a semiconductor parameter analyser (HP4145B, HP).

Samples for array transport studies were made by encapsulating fired arrays (grown on ITO) in a matrix of spin-cast poly(methyl methacrylate) (PMMA), exposing the wire tips by UV development of the top portion of the PMMA film, and then depositing metal contacts by thermal evaporation. The insulating PMMA matrix prevented potential short circuits due to pinholes in the nanowire film and provided mechanical stability for the measurement.

Mid-infrared transient absorption measurements: Mid-IR transient absorption measurements were performed with a home-built Ti:sapphire oscillator (30 fs, 88 MHz) and commercial regenerative amplifier (Spectra-Physics, Spitfire) that operates at 810 nm and 1 kHz repetition rate. Approximately 800 µJ of the beam was used to pump an optical parametric amplifier (OPA) (TOPAS, Quantronix), while 80 µJ was retained and frequency-doubled in BBO for use as the 405 nm pump beam. This beam was temporally delayed by a motorized stage and directed to the sample. The signal and idler beams from the OPA were combined in a $AgGaS_2$ crystal to create tunable mid-IR pulses (1000-3500 $cm^{-1}$). The residual 810 nm beam and the residual signal and idler beams were re-combined in a BBO crystal to create SFG at 510 nm and 575 nm. The 510 nm beam was directed to a separate delay stage and then to the sample. The pump beams were focused to a spot size of approximately 200-300 µm, with typical pump energies of 0.5-2 µJ. The pump beams were mechanically chopped at 500 Hz (synchronous with the laser), and separate boxcar integrators were triggered by the rejected and passed beams, allowing for independent detection channels of probe with pump ("sample") and without pump ("reference"). The sample signal was subtracted from the reference signal, and the result was divided by the reference to give the differential transmittance, which was converted to effective absorbance. The probe beam, which was typically centered at 2150 $cm^{-1}$ with a 250 $cm^{-1}$ bandwidth, was focused with a $CaF_2$ lens to a size of approximately 100-200 µm. The probe beam was collected after transmission through the sample and directed through bandpass filters before being focused onto a single-element MCT detector (IR Associates). An instrument response of 250-300 fs was determined by measuring the sub-50 fs rise of free-electron absorption in a thin Si wafer after blue or green pump.

Each transient plot (not shown) was an average of points taken on both forward and reverse scans (checked for reproducibility). Each point consists of approximately 500 averaged laser shots. Samples were translated after each scan in order to minimize probing dye photoproducts. However, samples were not moved during the scan because small inhomogeneities caused changes in the amplitude of the transient signal, obscuring the true kinetics.

Fabrication of Solar Cells: As-made nanowire films were first fired at 400° C. in air for 30 minutes to remove surface adsorbates and then dye-coated in a 0.5 mmol $l^{-1}$ solution of cis-bis(isothiocyanato)bis(2,2'-bipyridyl-4,4'-dicarboxylato)-ruthenium(II) (N3 dye) in dry ethanol for three hours at 25° C. The cells were constructed by sandwiching nanowire anodes together with thermally platinized conducting glass counter electrodes separated by 30-50 µm thick hot-melt spacers (Bynel, Dupont) and sealed by flash heating. The internal space of a cell was filled by injecting a liquid electrolyte (0.5 M LiI, 50 mM $I_2$, 0.5 M 4-tertbutylpyridine in 3-methoxypropionitrile).

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention. For example, any features of any of the nanowire arrays described herein can be combined with any features of any of the optoelectronic devices described herein without departing from the scope of the invention.

All patents, patent applications, and publications mentioned above are herein incorporated by reference in their entirety for all purposes. None of the patents, patent applications, and publications mentioned above is admitted to be prior art.

What is claimed is:

1. A method comprising:
providing a substrate;
depositing ZnO nanocrystals onto the substrate by dipping the substrate into a solution containing ZnO nanocrystals; and
contacting the substrate with a solution formed from $(Zn(NO_3)_2\ 6H_2O)$ and methenamine $(C_6H_{12}N_4)$.

2. The method of claim 1, wherein the substrate comprises either Si, sapphire, plastic, ITO, or F:SnO$_2$.

3. The method of claim 1 further comprising:
forming an array of nanowires on the substrate while the solution is at a temperature less than about 90° C. and at atmospheric pressure.

4. The method of claim 1, wherein the ZnO nanocrystals are about 5 to about 10 nanometers in diameter.

5. A method comprising:
providing a substrate;
depositing ZnO nanocrystals onto the substrate by dipping the substrate into a solution containing ZnO nanocrystals; and
contacting the substrate with a solution formed from $(Zn(NO_3)_2\ 6H_2O)$ and methenamine $(C_6H_{12}N_4)$,
wherein the deposited ZnO nanocrystals and the substrate are annealed prior to contacting the substrate with the solution formed from $(Zn(NO_3)_2\ 6H_2O)$ and methenamine $(C_6H_{12}N_4)$.

6. A method comprising:
providing a substrate;
depositing ZnO nanocrystals onto the substrate by dipping the substrate into a solution containing ZnO nanocrystals; and
contacting the substrate with a solution formed from $(Zn(NO_3)_2\ 6H_2O)$ and methenamine $(C_6H_{12}N_4)$,
wherein the ZnO nanocrystals are annealed at a temperature between about 50° C. and about 300° C.

7. The method of claim 6, wherein the ZnO nanocrystals are annealed at about 150° C.

8. The method of claim 1, wherein the ZnO nanocrystals are deposited on the substrate in a layer about 50 to about 200 nanometers thick.

9. The method of claim 1, wherein the solution formed from $(Zn(NO_3)_2\ 6H_2O)$ and methenamine $(C_6H_{12}N_4)$ is an aqueous solution formed from 0.025 M zinc nitrate hydrate and 0.025 M methenamine.

10. The method of claim 1 wherein the ZnO nanocrystals that are deposited on the substrate form a layer that has a thickness of about 10-15 nanometers.

11. The method of claim 1 further comprising forming an array of nanowires after contacting the substrate with the solution, wherein the nanowires have lengths of greater than about 20 microns.

12. The method of claim 1 further comprising dipping the substrate into the solution containing ZnO nanocrystals multiple times.

13. The method of claim 1 further comprising forming an array of nanowires after contacting the substrate with the solution formed from $(Zn(NO_3)_2\ 6H_2O)$ and methenamine $(C_6H_{12}N_4)$, wherein the nanowires have widths of about 100 nanometers or less and aspect ratios greater than about 10.

14. The method of claim 1 wherein the ZnO nanocrystals and the substrate are annealed prior to contacting the substrate with the solution formed from $(Zn(NO_3)_2\ 6H_2O)$ and methenamine $(C_6H_{12}N_4)$, but after the ZnO nanoparticles are deposited onto the substrate.

* * * * *